(12) United States Patent
Hsu et al.

(10) Patent No.: US 7,342,264 B2
(45) Date of Patent: Mar. 11, 2008

(54) MEMORY CELL AND METHOD FOR MANUFACTURING THE SAME

(75) Inventors: Tzu-Hsuan Hsu, Hsinchu (TW); Chao-I Wu, Hsinchu (TW); Ming-Hsiu Lee, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 11/302,738

(22) Filed: Dec. 13, 2005

(65) Prior Publication Data

US 2007/0132000 A1    Jun. 14, 2007

(51) Int. Cl.
*H01L 29/80* (2006.01)
*H01L 29/76* (2006.01)

(52) U.S. Cl. .................. 257/263; 257/264; 257/302; 257/334

(58) Field of Classification Search ............... 257/586, 257/263–267, 302, 328–334, 326
See application file for complete search history.

(56) References Cited

U.S. PATENT DOCUMENTS

| 6,657,252 | B2 | 12/2003 | Fried et al. | 257/316 |
| 6,831,310 | B1 | 12/2004 | Mathew | 257/270 |
| 7,075,148 | B2 * | 7/2006 | Hofmann et al. | 257/331 |
| 7,119,384 | B2 * | 10/2006 | Popp et al. | 257/250 |

OTHER PUBLICATIONS

"Multilevel Vertical-Channel SONOS Nonvolatile Memory on SOI" By Yong Kyu Lee et al. / IEEE Devices Letters, vol. 23, No. 11, Nov. 2002 / pp. 664-666.
"A Novel MNOS technology Using Gate Hole Injection in Erase Operation for Embedded Nonvolatile Memory Applications" By F. Ito et al. / 2004 Symposium on VLSI Technology Digest of Technical papers / pp. 80-81.
"Novel Dual Bit Tri-Gate Charge Trapping Memory Devices" By M. Specht et al. / IEEE Electron Device Letters, vol. 25, No. 12, Dec. 2004 / pp. 810-812.

* cited by examiner

*Primary Examiner*—Howard Weiss
*Assistant Examiner*—Steven H Rao
(74) *Attorney, Agent, or Firm*—J.C. Patents

(57) ABSTRACT

The invention is directed to a memory cell on a substrate having a plurality of shallow trench isolations form therein, wherein top surfaces of the shallow trench isolations are lower than a top surface of the substrate and the shallow trench isolations together define a vertical fin structure of the substrate. The memory cell comprises a straddle gate, a carrier trapping structure and at least two source/drain regions. The straddle gate is located on the substrate and straddles over the vertical fin structure. The carrier trapping structure is located between the straddle gate and the substrate, wherein the carrier trapping structure comprises a trapping layer directly in contact with the straddle gate and a tunnel layer located between the trapping layer and the substrate. The source/drain regions are located in a portion of the vertical fin structure of the substrate exposed by the straddle gate.

10 Claims, 3 Drawing Sheets

MEMORY CELL AND METHOD FOR MANUFACTURING THE SAME

BACKGROUND OF THE INVENTION

1. Field of Invention

The present invention relates to a memory cell and a method for manufacturing thereof. More particularly, the present invention relates to a memory cell having a vertical fin channel and a method for manufacturing thereof.

2. Description of Related Art

Memory, so to speak, is a semiconductor device for storing data or information. When the function of a computer microprocessor becomes more powerful and the programs and computation of the software gets more complicated, the demand for the capacity of a memory increases accordingly. In order to satisfy the trend of the demand mentioned above, the technology and process to manufacture the inexpensive memory with high capacity has become the drive for manufacturing a high integrated device.

In addition, with the highly demanding on smaller and smaller electronic equipments, the size of the memory device is decreased as well. However, with the decreasing of the size of the memory device, the driving current is limited and not large enough for programming or reading operation. Furthermore, with the decreasing of the size of the memory device, the channel length between the source/drain regions is decreased so that the short channel effect and the drain induced barrier lowering effect is getting serious.

Currently, a field effect transistor with a fin type channel is introduced. However, it is necessary to manufacturing this kind of field effect transistor on the silicon-on-insulator wafer and to utilize electron beam to further define a thin fin channel. Therefore, the manufacturing cost is high. Hence, how to decrease the size of the memory cell with the increase of the memory storage density and to decrease manufacturing cost becomes the main study task in the current manufacturing technology.

SUMMARY OF THE INVENTION

Accordingly, at least one objective of the present invention is to provide a memory cell having a vertical fin channel capable of solving the short channel effect and the drain induced barrier lowering effect caused by shrinking the size of the memory cell.

At least another objective of the present invention is to provide a method for forming a memory cell having a vertical fin channel. By applying the method of the present invention, the manufacturing cost is decreased and the memory density of the memory cell is increased.

At least the other objective of the present invention is to provide operating methods for the memory cell. Because the tunnel layer is punched through by the carrier once in a, programming-erasing cycle, the life time of the tunnel layer is relatively longer. Hence, the reliability of the memory cell is high.

To achieve these and other advantages and in accordance with the purpose of the invention, as embodied and broadly described herein, the invention provides a memory cell on a substrate having a plurality of shallow trench isolations form therein, wherein top surfaces of the shallow trench isolations are lower than a top surface of the substrate and the shallow trench isolations together define a vertical fin structure of the substrate. The memory cell comprises a straddle gate, a carrier trapping structure and at least two source/drain regions. The straddle gate is located on the substrate and straddles over the vertical fin structure. The carrier trapping structure is located between the straddle gate and the substrate, wherein the carrier trapping structure comprises a trapping layer directly in contact with the straddle gate and a tunnel layer located between the trapping layer and the substrate. The source/drain regions are located in a portion of the vertical fin structure of the substrate exposed by the straddle gate.

In the present invention, the memory cell further comprises two carrier storage region pairs located in a portion of the trapping layer on opposite sidewalls of the vertical fin structure of the substrate respectively. Furthermore, the carrier storage regions of each carrier storage region pair are located adjacent to the source/drain regions respectively. In addition, the memory cell comprises a cap layer located between a top surface of the vertical fin structure and the carrier trapping structure. The memory cell also includes at least two pocket doped regions located below the source/drain regions respectively and under the straddle gate in the vertical fin structure of the substrate. Moreover, the material of the trapping layer is selected from a group consisting of silicon nitride and aluminum oxide. Further, the tunnel layer is made of silicon oxide and the straddle gate is made of doped polysilicon. Also, the top surface of the shallow trench isolation is lower than bottom surfaces of the source/drain regions.

The present invention also provides a method for manufacturing a memory cell on a substrate which has a plurality of shallow trench isolations formed therein, wherein top surfaces of the shallow trench isolations are lower than a top surface of the substrate and the shallow trench isolations together define a vertical fin structure. The method comprises steps of shrinking a width of the vertical fin structure of the substrate and then forming a cap layer on a top surface of the vertical fin structure of the substrate. Furthermore, a carrier trapping structure is formed over the substrate and then a conductive layer is formed on the carrier trapping structure. Thereafter, the conductive layer and the carrier trapping structure are patterned to form a straddle gate structure, wherein the straddle gate structure straddles over the vertical fin structure of the substrate. Finally, a plurality of source/drain regions are formed in a portion of the vertical fin structure of the substrate exposed by the straddle gate structure.

In the present invention, the step of shrinking the width of the vertical fin structure of the substrate comprises steps of performing a thermal oxidation process to transform a portion of the substrate exposed by the shallow trench isolations into silicon oxide and then removing the silicon oxide. Also, the step of forming the cap layer comprises steps of forming a pad oxide layer over the substrate and then forming a silicon nitride layer over the substrate. Thereafter, a self-aligned spacer is formed over the sidewall of the vertical fin structure of the substrate and then an oxidation process is performed to form the cap layer on the top surface of the vertical fin structure of the substrate. Finally, the self-aligned spacer is removed. Notably, the carrier trapping structure comprises a trapping layer directly in contact with the conductive layer. And, the material of the trapping layer is selected from a group consisting of silicon nitride and aluminum oxide. Also, the carrier trapping structure further comprises a tunnel layer located between the trapping layer and the substrate. Furthermore, the top surfaces of the shallow trench isolations are lower than bottom surfaces of the source/drain region. In addition, before the step of forming the source/drain regions, further comprising a step of forming a plurality of pocket implant regions in the vertical fin structure under the straddle gate structure.

The present invention further provides a method of programming a memory cell having a first doped region and a second doped region separately located in a vertical fin structure of a substrate and a straddle gate structure straddling over a portion of the vertical fin structure of a substrate between the first doped region and the second doped region, wherein the straddle gate structure comprises a gate electrode and a trapping layer between the gate electrode and the substrate, and the trapping layer is directly in contact with the gate electrode, and the trapping layer possesses a first carrier storage region and a second carrier storage region located on opposite sidewalls of the vertical fin structure of the substrate adjacent to the first doped region respectively, and the trapping layer further comprises a third carrier storage region and a fourth carrier storage region located on opposite sidewalls of the vertical fin structure of the substrate adjacent to the second doped region respectively. The method comprises a step of applying a first voltage on the straddle gate structure and applying a first forward bias from the first doped region to the second doped region to inject at least two carriers into the first carrier storage region and the second carrier storage region respectively.

In the present invention, the memory cell is programmed in a way of channel hot electron programming process while the first voltage is of about 10 voltage and the first forward bias is accomplished by applying 5 voltage on the first doped region and grounding the second doped region.

The present invention provides a method of performing an erasing operation on a memory cell which has a first doped region and a second doped region separately located in a vertical fin structure of a substrate and a straddle gate structure straddling over a portion of the vertical fin structure of a substrate between the first doped region and the second doped region, wherein the straddle gate structure comprises a gate electrode and a trapping layer between the gate electrode and the substrate, and the trapping layer is directly in contact with the gate electrode, and the trapping layer possesses a first carrier storage region and a second carrier storage region located on opposite sidewalls of the vertical fin structure of the substrate adjacent to the first doped region respectively, and the trapping layer further comprises a third carrier storage region and a fourth carrier storage region located on opposite sidewalls of the vertical fin structure of the substrate adjacent to the second doped region respectively. The method comprises a step of injecting a plurality of holes from the straddle gate structure into the trapping layer so as to compensate a plurality of carriers stored in the first carrier storage region, the second carrier storage region, the third carrier storage region and the fourth carrier storage region.

In the present invention, the step of injecting the holes into the trapping layer comprises a step of applying a second voltage on the straddle gate structure and grounding the first doped region and the second doped region. Under the situation mentioned above, the memory cell is erased in a way of Fowler-Nordheim hole injection process while the second voltage is of about 12 voltage.

The invention provides a method of reading a memory cell which has a first doped region and a second doped region separately located in a vertical fin structure of a substrate and a straddle gate structure straddling over a portion of the vertical fin structure of a substrate between the first doped region and the second doped region, wherein the straddle gate structure comprises a gate electrode and a trapping layer between the gate electrode and the substrate, and the trapping layer is directly in contact with the gate electrode, and the trapping layer possesses a first carrier storage region and a second carrier storage region located on opposite sidewalls of the vertical fin structure of the substrate adjacent to the first doped region respectively, and the trapping layer further comprises a third carrier storage region and a fourth carrier storage region located on opposite sidewalls of the vertical fin structure of the substrate adjacent to the second doped region respectively. The method comprises a step of applying a third voltage on the straddle gate structure and applying a first reverse bias from the first doped region to the second doped region so as to read a storage state of the first carrier storage region and the second carrier storage region.

In the present invention, the memory cell is read in a way of reverse read process while the third voltage is of about 5 voltage and the first reverse bias is accomplished by grounding the first doped region and applying 1.6 voltage on the second doped region.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The manufacturing a memory cell according to one preferred embodiment of the present invention.

DESCRIPTION OF THE PREFERRED EMBODIMENTS

Figure 1:
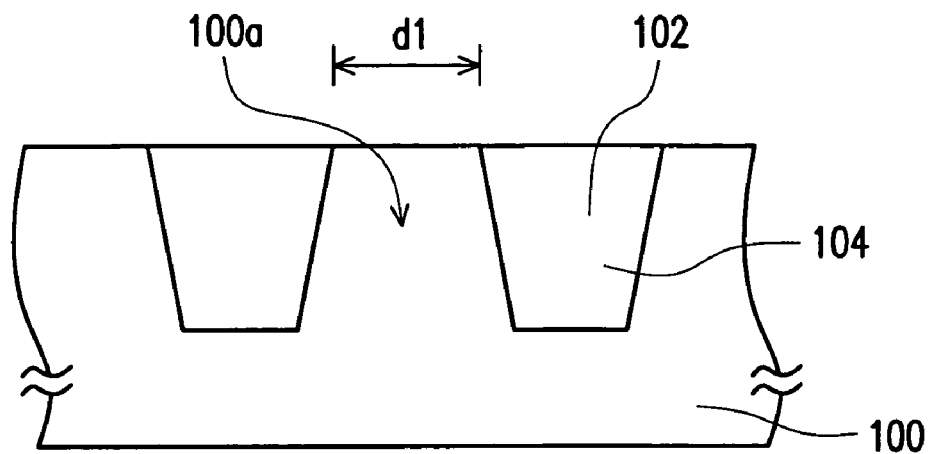
FIGS. 1 through 3 are cross-sectional views illustrating a method for manufacturing a memory cell according to one preferred embodiment of the present invention.
Figure 2:
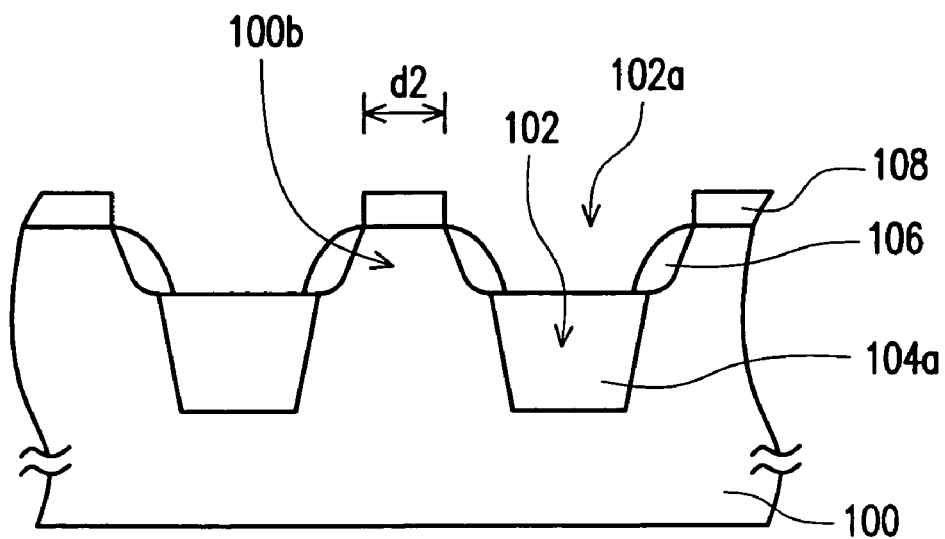
Figure 3:
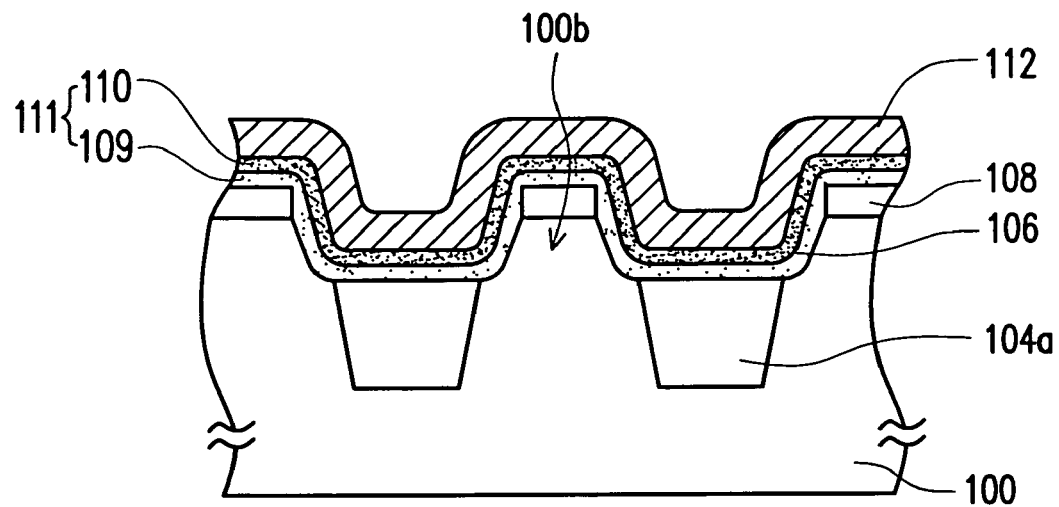

FIGS. 1 through 3 are cross-sectional views illustrating a method for manufacturing a memory cell according to one preferred embodiment of the present invention. As shown in FIG. 1, a substrate 100 having several shallow trench isolations 104 formed therein is provided. The shallow trench isolations 104 fill out the trench 102 formed in the substrate 100 respectively and the shallow trench isolation can be, for example but not limited to, made of silicon oxide. Notably, the shallow trench isolations 104 together define a preliminary vertical fin structure 100a of the substrate 100. As shown in FIG. 2, a portion of the shallow trench isolation 104 is removed to expose the top opening portion 102a of the trench 102, wherein the shallow trench isolation 104 (as shown in FIG. 1) is transformed into a shallow trench isolation 104a. The formation of the shallow trench isolation 104 and the transformation of the shallow trench isolation 104a from the shallow trench isolation 104 can be accomplished by using the conventional process for manufacturing a shallow trench isolation.

Thereafter, as shown in FIG. 2, a process is performed to further shaping the preliminary vertical fin structure 100a of the substrate 100 with a width d1 (as shown in FIG. 1) into a vertical fin structure 100b of the substrate 100 with a width d2, wherein the width d2 is narrower than width d1. Notably, the method for transforming the preliminary vertical fin structure 100a of the substrate 100 into the vertical fin structure 100b of the substrate 100 comprises steps of performing a thermal oxidation process to transform a portion of the substrate 100 exposed by the shallow trench isolations 104a into silicon oxide (not shown) and then removing the silicon oxide. Therefore, with enlarging the profile of the top opening 102a, the preliminary vertical fin structure 100a is shaped into the vertical fin structure 100b with relatively narrow width d2.

Furthermore, as shown in FIG. 2, a pad oxide layer (not shown) and a silicon nitride layer (not shown) are formed over the substrate 100 sequentially. Then, a self-aligned spacer 106 is formed over the sidewall of the vertical fin structure 100b, i.e. the sidewall of the top opening portion 102a. Then, a cap layer 108 is formed over the top surface of the vertical fin structure 100b of the substrate 100. The method for forming the self-aligned spacer 106 and the cap layer 108 comprises steps of forming a material layer (not shown) over the substrate 100, performing an etching back process to remove a portion of the material layer to form the spacer 106 over the sidewall of the vertical fin structure 100b of the substrate 100 and then performing an oxidation process to form the cap layer 108 over the top surface of the vertical fin structure 100b of the substrate 100. It should be noticed that the spacer 106 can be, for example but not limited to, made of silicon nitride and the cap layer 108 can be, for example but not limited to, made of silicon oxide. Because of the formation of the cap layer 108, the corner of the vertical fin structure 100b is properly rounded for further suppressing the point discharging.

As shown in FIG. 3, the spacer 106 is removed. Then, a carrier trapping structure 111 and a conductive layer 112 are formed over the substrate 100 sequentially. The carrier trapping structure 111 comprises a tunnel layer 109 located over the substrate 100 and a trapping layer 110 on the tunnel layer 109 and directly in contact with the conductive layer 112. The material of the trapping layer 110 can be, for example but not limited to, selected from a group consisting of silicon nitride and aluminum oxide and the tunnel layer 109 can be, for example but not limited to, made of silicon oxide. Also, the conductive layer 112 can be, for example but not limited to, made of doped polysilicon. Preferably, the conductive layer 112 can be made of doped polysilicon with a P+ conductive type.

Figure 4:
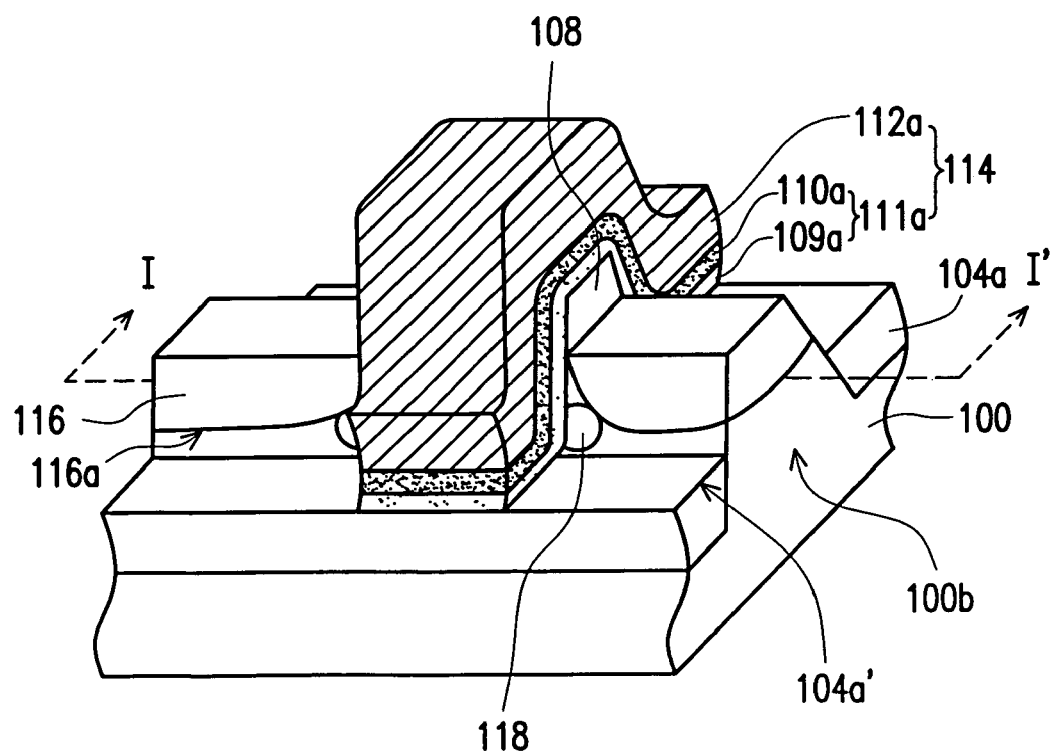
FIG. 4 is a 3-dimensional view of a memory cell according to one preferred embodiment of the present invention.

FIG. 4 is a 3-dimensional view of a memory cell according to one preferred embodiment of the present invention. Thereafter, as shown in FIG. 4, the conductive layer 112 and the carrier trapping structure 111 are patterned to form a straddle gate structure 114 straddling over the vertical fin structure 100b of the substrate 100, wherein the carrier trapping structure 111 and the conductive layer 112 are transformed into the carrier trapping structure 111a and the straddle gate 112a respectively and the carrier trapping structure 111a and the straddle gate 112a together form a straddle gate structure 114. Then, a plurality of source/drain regions 116 are formed in a portion of the vertical fin structure 100b of the substrate 100 exposed by the straddle gate structure 114. Notably, a top surface 104a' of the shallow trench isolation 104a is lower than a bottom surface 116a of the source/drain region 116. In addition, the source/drain regions 116 can be formed by performing an implantation process to form doped regions in a portion of the vertical fin structure 100b of the substrate 100 exposed by the straddle gate structure 114. Furthermore, before the source/drain regions 116 are formed in the vertical fin structure 100b of the substrate 100, a plurality of pocket doped regions 118 are formed in the vertical fin structure 100b below the positions predetermined to form the source/drain regions 116 and under the straddle gate 112a.

Figure 4A:
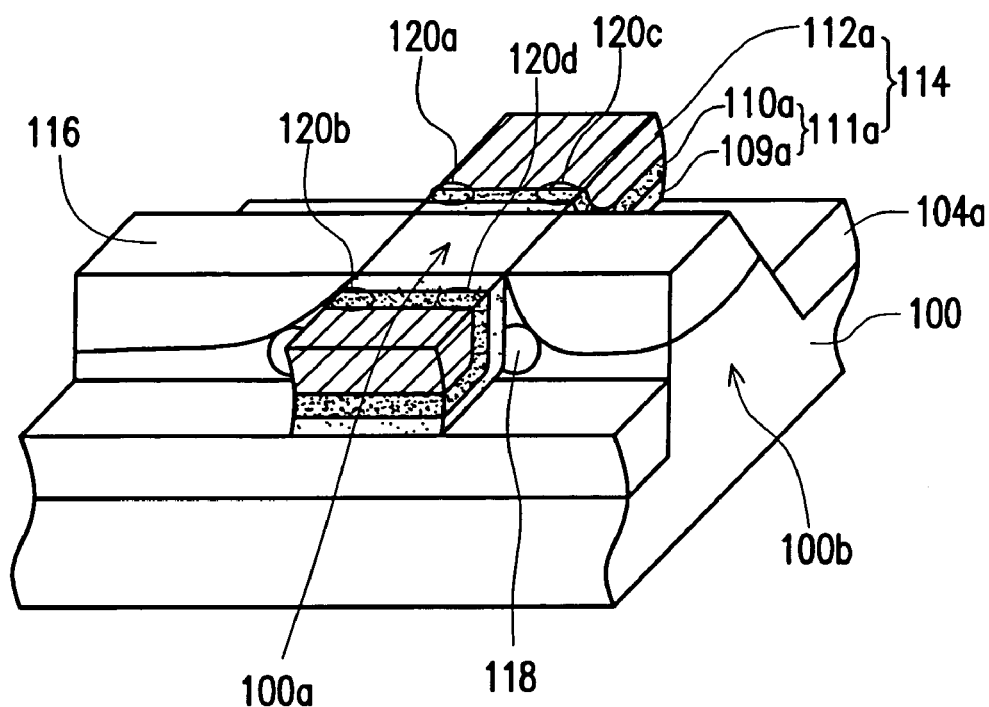
FIG. 4A is a cross-sectional view of the memory cell shown FIG. 4 along line I-I'.
Figure 4B:
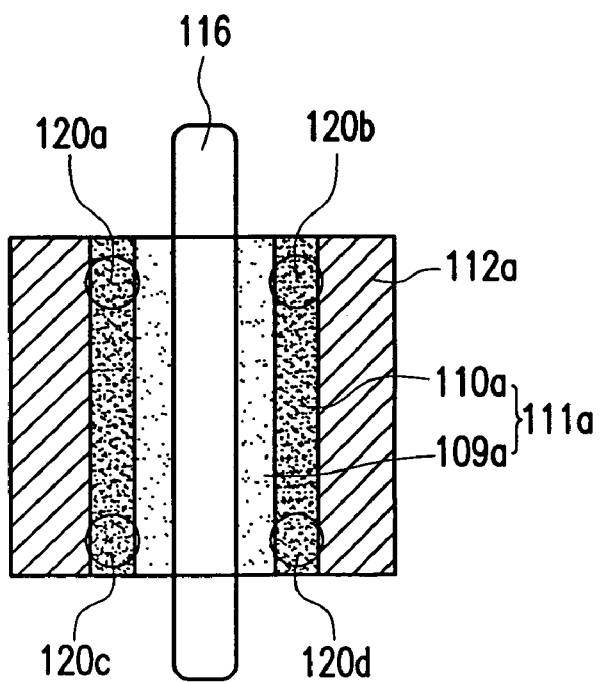
FIG. 4B is a top view of the memory cell shown in FIG. 4A.

FIG. 4A is a cross-sectional view of the memory cell shown FIG. 4 along line I-I'. FIG. 4B is a top view of the memory cell shown in FIG. 4A. As shown in FIG. 4A together with FIG. 4B, there exist two carrier storage region pairs (i.e. a first carrier storage region 120a, a third carrier storage region 120c and a second carrier storage region 120b, a fourth carrier storage region 120d) located in a portion of the trapping layer 110a on opposite sidewalls of the vertical fin structure 100b of the substrate 100 respectively. Furthermore, the carrier storage regions of each carrier storage region pair are located adjacent to the source/drain regions 116 respectively.

In addition, as shown in FIGS. 4A and 4B, while the memory cell according to this embodiment of the present invention is programmed by storing carrier in both the first carrier storage region 120a and the second carrier storage region 120b, a first voltage is applied on the straddle gate 112a. Meanwhile, a first forward bias from the source/drain region 116 adjacent to the first carrier storage region 120a and the second carrier storage region 120b to the other source/drain region 116 adjacent to the third carrier storage region 120c and the fourth carrier storage region 120d is applied so as to inject at least two carriers into the first carrier storage region 120a and the second carrier storage region 120b respectively. Notably, the first voltage is of about 10 voltage and the first forward bias is accomplished by applying 5 voltage on the source/drain region 116 adjacent to the first carrier storage region 120a and the second carrier storage region 120b and grounding the other source/drain region 116 adjacent to the third carrier storage region 120c and the fourth carrier storage region 120d. Under the situation mentioned above, the memory cell is programmed in a way of channel hot electron programming process.

Under the circumstance that at least one of the first carrier storage region 120a and the second carrier storage region 120b of the memory cell is at the carrier storage state, the memory cell can be erased by applying a second voltage on the straddle gate 112a simultaneously with grounding the both source/drain region 116 adjacent to the first carrier storage region 120a and the second carrier storage region 120b and the third carrier storage region 120c and the fourth carrier storage region 120d respectively. Notably, the second voltage is of about 12 voltage. Under the situation mentioned above, the memory cell is erased in a way of Fowler-Nordheim hole injection process. By applying positive voltage on the straddle gate 112a, the holes in the straddle gate 112a are pouring down to the trapping layer 110a where the carriers are stored. Therefore, the injected holes from the straddle gate 112a compensate the stored carriers in the carrier storage regions 120a, 120b, 120c and 120d. Since the trapping layer 110a is directly in contact with the straddle gate 112a, the erasing speed is relatively faster. Furthermore, because of holes pouring down from the straddle gate 112a to the trapping layer 110a, the memory cell is erased block by block. Additionally, in the Fowler-Nordheim hole injection process, unlike the programming process, there is no carrier punching through the tunnel layer 109a under the trapping layer 110a so that the life time of the tunnel layer 109a is relatively longer. That is, in the programming-erasing cycle, the tunnel layer 109a is punched through by the carriers only once so that the damage probability caused by carrier punching through is decreased. Hence, the reliability of the memory cell is increased.

Moreover, while at least one of the first carrier storage region 120a and the second carrier storage region 120b is at the carrier storage state, the memory cell can be read by applying a third voltage on the straddle gate 112a. Simultaneously, a first reverse bias from the source/drain region 116 adjacent to the first carrier storage region 120a and the second carrier storage region 120b to the other source/drain region 116 adjacent to the third carrier storage region 120c and the fourth carrier storage region 120d is applied on the memory cell so as to read whether a storage state of the first carrier storage region and the second carrier storage region is the carrier storage state or the non-carrier storage state.

Notably, the third voltage is of about 5 voltage and the first reverse bias is accomplished by grounding the source/drain region 116 adjacent to the first carrier storage region 120a and the second carrier storage region 120b and applying 1.6 voltage on the other source/drain region 116 adjacent to the third carrier storage region 120c and the fourth carrier storage region 120d. Under the situation mentioned above, the memory cell is read in a way of reverse read process.

In the present invention, because a portion of the vertical fin structure 100b under the straddle gate structure 114 serves as a vertical fin channel of the memory cell, the problems caused by short channel effect and the drain induced barrier lowering effect can be solved. Furthermore, the vertical fin structure of the substrate is directly defined by the shallow trench isolations formed in the substrate. Also, the shallow trench isolations are formed by using the conventional manufacturing process and the vertical fin structure is further shrunk by simply enlarging the profile of the top opening portion of the trench. Hence, it is unnecessary to use the relatively expensive silicon-on-insulator wafer as the substrate for forming the memory cell according to the present invention. Further, it is also unnecessary to utilize electron beam to narrow the vertical fin structure. Therefore, the manufacturing cost is decreased. Moreover, in the memory cell according to the present invention, there are four carrier storage regions respectively located in the trapping layer over both sidewalls of the vertical fin structure of the substrate so that the memory density is increased.

Furthermore, during the memory cell is erased, since the trapping layer is directly in contact with the straddle gate, the erasing speed is relatively faster. Furthermore, because of holes pouring down from the straddle gate to the trapping layer, the memory cell is erased block by block. Also, the injected holes from the straddle gate compensate the stored carriers in the carrier storage regions during the erasing process so that the tunnel layer is punched through by the carriers only once in a programming-erasing cycle. Hence, the damage probability caused by carrier punching through is decreased and the reliability of the memory cell is increased.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A memory cell on a substrate having a plurality of shallow trench isolations form therein, wherein top surfaces of the shallow trench isolations are lower than a top surface of the substrate and the shallow trench isolations together define a vertical fin structure of the substrate, the memory cell comprising:
 a straddle gate located on the substrate, wherein the straddle gate straddles over the vertical fin structure;
 a carrier trapping structure located between the straddle gate and the substrate, wherein the carrier trapping structure comprises a trapping layer directly in contact with the straddle gate and a tunnel layer located between the trapping layer and the substrate; and
 at least two source/drain regions located in a portion of the vertical fin structure of the substrate exposed by the straddle gate,
 wherein there are two carrier storage regions in a portion of the carrier trapping layer on a sidewalls of the vertical fin structure of the substrate located adjacent to the source/drain regions respectively.

2. The memory cell of claim 1 further comprising two carrier storage region pairs located in a portion of the trapping layer on opposite sidewalls of the vertical fin structure of the substrate respectively.

3. The memory cell of claim 2, wherein the carrier storage regions of each carrier storage region pair are located adjacent to the source/drain regions respectively.

4. The memory cell of claim 1 further comprising a cap layer located between a top surface of the vertical fin structure and the carrier trapping structure.

5. The memory cell of claim 1 further comprising at least two pocket doped regions located below the source/drain regions respectively and under the straddle gate in the vertical fin structure of the substrate.

6. The memory cell of claim 1, wherein the material of the trapping layer is selected from a group consisting of silicon nitride and aluminum oxide.

7. The memory cell of claim 1, wherein the tunnel layer is made of silicon oxide.

8. The memory cell of claim 1, wherein the straddle gate is made of doped polysilicon.

9. The memory cell of claim 8, wherein the conductive type of the doped polysilicon is P+.

10. The memory cell of claim 1, wherein the top surface of the shallow trench isolation is lower than bottom surfaces of the source/drain regions.

* * * * *